(12) United States Patent
Bassett et al.

(10) Patent No.: US 11,589,475 B2
(45) Date of Patent: Feb. 21, 2023

(54) HIGH PERFORMANCE MODULAR DIE-CAST ENCLOSURE SYSTEM

(71) Applicant: Redline Communications Inc., Markham (CA)

(72) Inventors: Mark Douglas Bassett, Newmarket (CA); Bradford K M Stimpson, Beeton (CA); Alexandre Gourari, Toronto (CA)

(73) Assignee: Redline Communications Inc., Markham (CA)

( * ) Notice: Subject to any disclaimer, the term of this patent is extended or adjusted under 35 U.S.C. 154(b) by 0 days.

(21) Appl. No.: 17/380,417

(22) Filed: Jul. 20, 2021

(65) Prior Publication Data
US 2023/0022850 A1    Jan. 26, 2023

(51) Int. Cl.
| | | |
|---|---|---|
| H05K 7/02 | (2006.01) | |
| H05K 7/04 | (2006.01) | |
| H05K 5/02 | (2006.01) | |
| H01R 12/73 | (2011.01) | |

(52) U.S. Cl.
CPC .......... *H05K 7/023* (2013.01); *H01R 12/737* (2013.01); *H05K 5/0247* (2013.01); *H05K 7/026* (2013.01)

(58) Field of Classification Search
USPC .......................................... 361/728, 730, 752
See application file for complete search history.

(56) References Cited

U.S. PATENT DOCUMENTS

| | | | | |
|---|---|---|---|---|
| 5,825,630 A | * | 10/1998 | Taylor .................... | H05K 7/023 361/791 |
| 2004/0257763 A1 | * | 12/2004 | Andresen ............ | H05K 7/1487 361/679.48 |
| 2005/0083664 A1 | * | 4/2005 | Choi ...................... | H05K 1/144 361/760 |
| 2007/0224854 A1 | * | 9/2007 | Bacha .................... | H05K 1/144 439/79 |

* cited by examiner

*Primary Examiner* — Hung S. Bui
(74) *Attorney, Agent, or Firm* — Stratford Group Ltd.

(57) ABSTRACT

A modular die cast enclosure comprising a top section with a top mid-plane and a bottom section with a bottom mid-plane and an internal bottom cover. The bottom section having one or more of a first type of connectors. The top section having one or more of a second type of connectors on. The internal bottom cover having one or more of a third type of connectors. Wherein said first type of connectors couple with said second type of connectors when the top section is placed on the bottom section and allow to electrically connect said top and bottom sections via said third type of connectors.

20 Claims, 4 Drawing Sheets

HIGH PERFORMANCE MODULAR DIE-CAST ENCLOSURE SYSTEM

BACKGROUND

To develop a transceiver, the following characteristics are required:
High speed data transmission, up to 10 GHz.
Increased bandwidth.
Increased reliability.
Increased EMC immunity.
Tolerance to shock & vibration.
Low cost stranded wire or flat ribbon cables that interconnect PCBs cannot meet the required electrical performance. There is a need to provide these characteristics in a die-cast enclosure while providing an option to interchange enclosure halves (self-contained modules), in order to create product variants.

BRIEF SUMMARY

In a first embodiment, a modular die cast enclosure is disclosed, comprising a top section with a top mid-plane; a bottom section with a bottom mid-plane and an internal bottom cover; one or more of a first type of connectors on the bottom section; one or more of a second type of connectors on the top section; one or more of a third type of connectors on the internal bottom cover; wherein said first type of connectors couple with said second type of connectors when the top section is placed on the bottom section and allow to electrically connect said top and bottom sections via said third type of connectors.

In a second embodiment, the modular die cast enclosure further comprises an internal top cover with one or more fourth type connectors to cover said top section wherein said top second types of connectors couple to the fourth types of connectors and the third types of connector couple to the other side of the fourth type of connectors to electrically connect said top and bottom section.

In a third embodiment, a modular die cast enclosure is disclosed, comprising a top section; a bottom section with a bottom mid-plane and an internal bottom cover; one or more of a first type of connectors on the bottom section; one or more of a third type of connectors on the internal bottom cover; wherein said first type of connectors couples with the third type of connector on internal cover to electrically connect boards in the bottom section.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
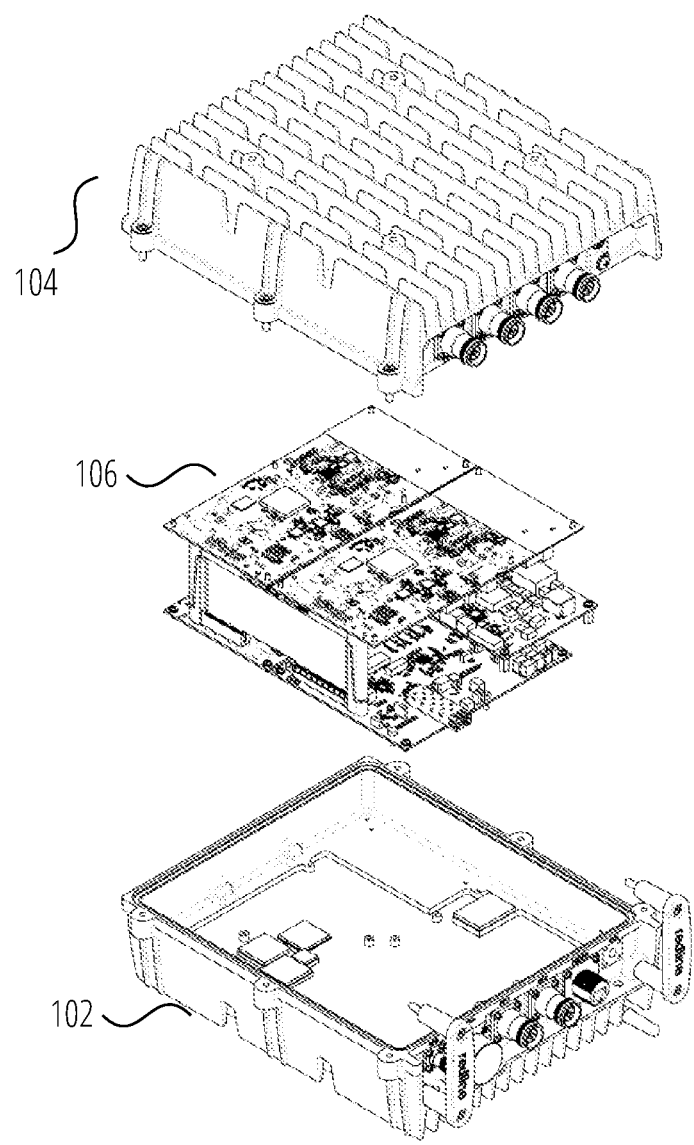
FIG. 1 illustrates existing die cast enclosures.

FIG. 1 depicts a typical tri-band radio as known in the art. The PCBs 106 are located in the bottom casing 102 and top casing 104.

Figure 2:
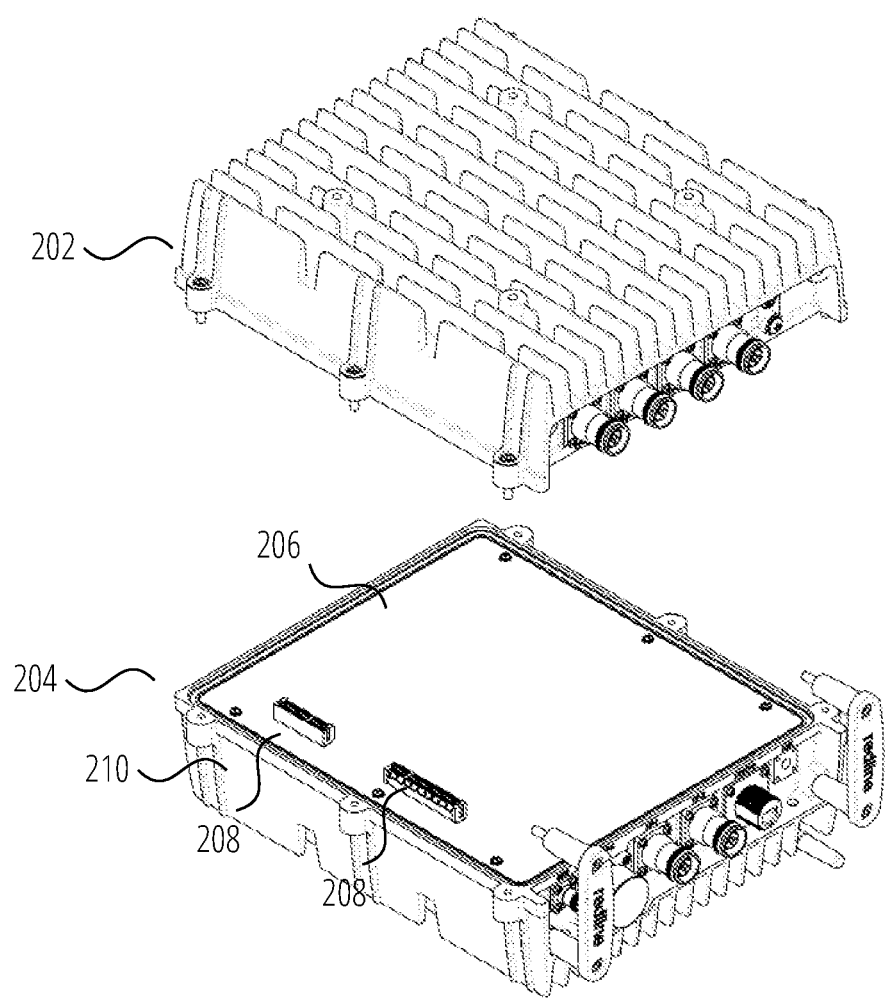
FIG. 2 illustrates an embodiment of a modular die cast enclosure.

As per FIG. 2, in one embodiment, Connectors 208 and mid-plane PCB are used in a die-cast enclosure with a top section 202 and bottom section 204. Typically, connectors and mid-planes, are used in sheet metal enclosures (computer chassis). The mid plane PCB 210 is cut to half the size of typical top casing 104. The connectors 208 allow electrical connection between the top section 202 and the bottom section 204. Using solid mid plane PCB 210 and connectors 208 allow to offer a modular architecture and meet the performance requirements that cannot be achieved with stranded wires or flexible ribbons.

The use of internal bottom cover 206 (plates) on the top section 202 and bottom section 204, allows each enclosure half to be used as a stand-alone module.

The internal bottom cover 206 is a plate (or other fabricated form, i.e. sheet metal, high/low pressure molded part), that is added to the bottom section 204 or top section 202 of the housing. The internal bottom cover 206 is supported by custom bosses, off-the-shelf standoffs, or other hardware configurations. The internal bottom cover 206 may be electrically/thermally conductive, or non-conductive, depending on the product requirements.

The purpose of the internal bottom cover 206 is multi-functional; a) protection of the internal components from external entry of foreign objects, when the complete unit (top and bottom sections) are separated in the field, b) mounting surface for electrical interconnect(s) and other components, c) RF/EMI shielding, between enclosure halves and d) can be constructed to provide thermal radiation.

The top section 202 and bottom section 204 are electrically connected by internal mid-planes. These mid-planes interface with the connectors on the plate.

Figure 3:
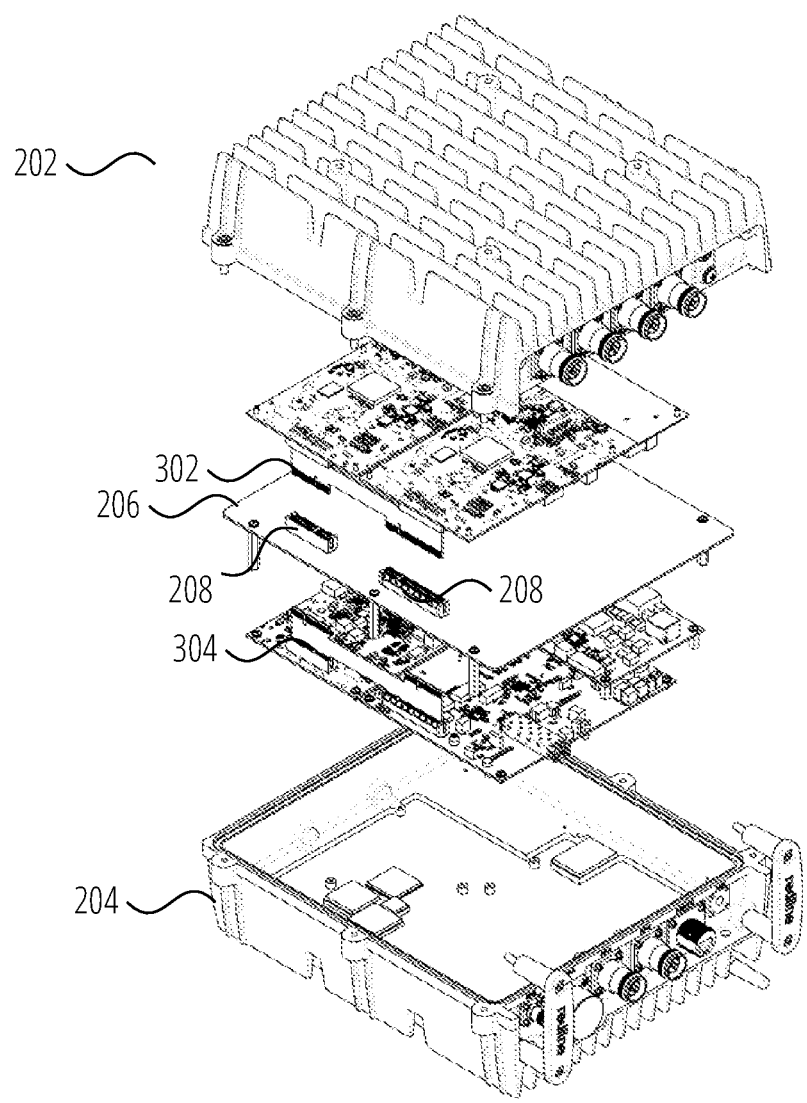
FIG. 3 illustrates an embodiment of a modular die cast enclosure.

FIG. 3 depicts the modular embodiment of the top section 202 and bottom section 204 in the die-cast enclosure. With the internal bottom cover 206 separating the two sections. Optionally only one internal bottom cover 206 can be used or one internal top cover (not shown) on the top section 202 and one internal bottom cover 206 on the bottom section 204. The top section 202 and bottom section 204 are modular and are combined by coupling the Top mid planes 302 with the internal bottom cover 206 connectors 208.

Figure 4:
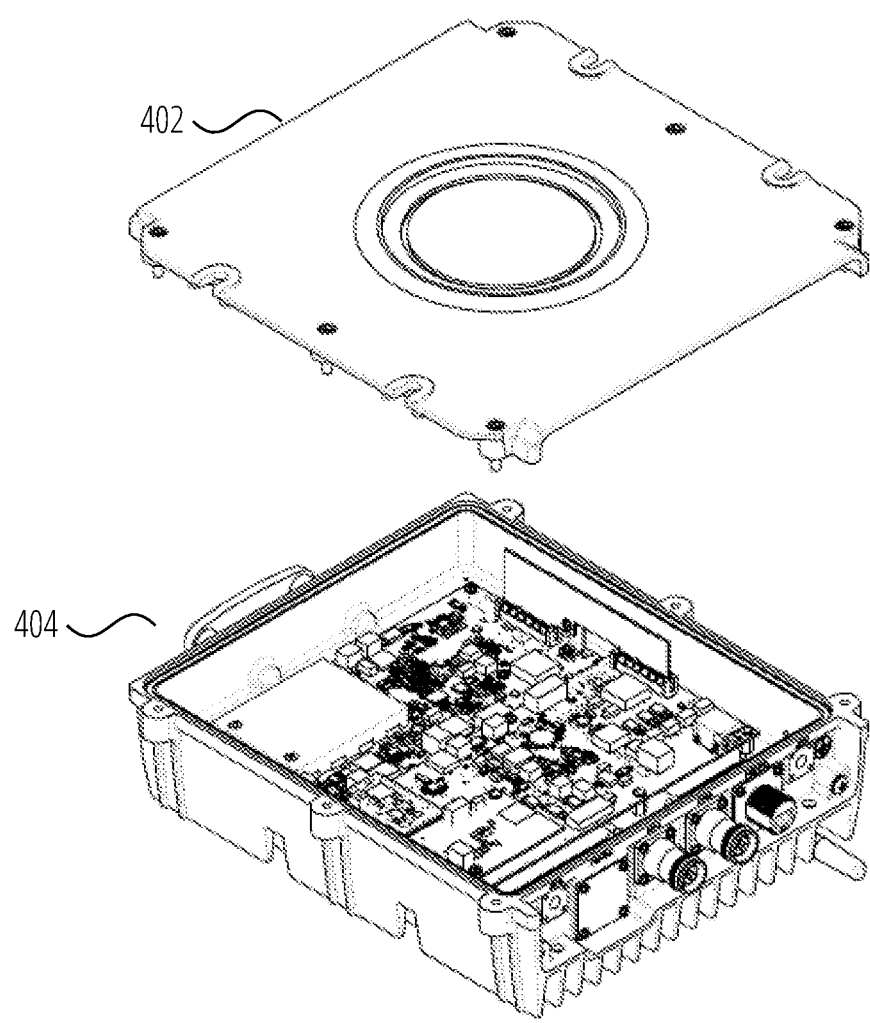
FIG. 4 illustrates an single band embodiment of a modular die cast enclosure.

FIG. 4 depicts another embodiment for a single band unit. In this case, the internal cover 402 has no connectors on the outside. In this case, for example, the PCIe connectors are used to connect the Radio Link PCB and Host Card PCB.

The foregoing descriptions of specific embodiments of the present invention have been presented for purposes of illustration and description. They are not intended to be exhaustive or to limit the invention and method of use to the precise forms disclosed. Obviously, many modifications and variations are possible in light of the above teaching. The embodiments described were chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient but is intended to cover the application or implementation without departing from the spirit or scope of the claims of the present invention.

What is claimed is:

1. A modular die cast enclosure system comprising:
a bottom section including a bottom casing, a bottom mid-plane, and one or more first connectors;

a top section including a top casing, a top mid-plane, and one or more second connectors;

an internal cover comprised in one of the top and bottom sections, one or more third connectors provided in the internal cover;

wherein, when the top section is secured to the bottom section, said top casing mates with said bottom casing forming an enclosure, and said one or more first connectors electrically couple with said one or more second connectors via said one or more third connectors allowing said top and bottom sections to electrically connect via said one or more third connectors.

2. The modular die cast enclosure system of claim 1 wherein said one or more first connectors are male and said one or more second connectors are female.

3. The modular die cast enclosure system of claim 1 wherein said one or more first connectors are female and said one or more second connectors are male.

4. The modular die cast enclosure system of claim 1, wherein said internal cover comprised in one of the top and bottom sections allows said one of the top and bottom sections to be used as a stand-alone module.

5. The modular die cast enclosure system of claim 1, wherein the internal cover comprises a plate made of one of sheet metal or a high/low pressure molded material.

6. The modular die cast enclosure system of claim 1, wherein the internal cover is mounted to the one of the top and bottom sections via one of custom bosses and off-the-shelf standoffs.

7. The modular die cast enclosure system of claim 1, wherein the internal cover comprises material which is electrically conductive.

8. The modular die cast enclosure system of claim 1, wherein the internal cover comprises material which is thermally conductive.

9. The modular die cast enclosure system of claim 1, wherein the internal cover comprises material which is electrically non-conductive.

10. The modular die cast enclosure system of claim 1, wherein the internal cover comprises material which is thermally non-conductive.

11. The modular die cast enclosure system of claim 1, wherein the internal cover substantially covers an entire opening of the top or bottom casing of the one of the top and bottom sections in which the internal cover is comprised.

12. The modular die cast enclosure system of claim 11, wherein, when the top section is not secured to the bottom section, the internal cover provides for the one of the top and bottom sections in which it is comprised, protection from external entry of foreign objects.

13. The modular die cast enclosure system of claim 11, wherein, when the top section is secured to the bottom section, the internal cover provides a mounting surface for said one or more third connectors and other components.

14. The modular die cast enclosure system of claim 11, wherein, when the top section is secured to the bottom section, the internal cover provides RF/EMI shielding between the top and bottom sections.

15. The modular die cast enclosure system of claim 11, wherein, when the top section is secured to the bottom section, the internal cover provides thermal radiation.

16. The modular die cast enclosure system of claim 1, wherein said one or more first connectors are provided on said top mid-plane and said one or more second connectors are provided on said bottom mid-plane and wherein, when the top section is secured to the bottom section, said top and bottom mid-planes provide electrical connection between said top and bottom sections via said one or more first and second connectors coupling to said one or more third connectors provided in the internal cover.

17. The modular die cast enclosure system of claim 1, further comprising:

a second internal cover comprised in the other one of the top and bottom sections in which the internal cover is not comprised, one or more fourth connectors provided in the second internal cover, wherein, when the top section is secured to the bottom section, said one or more fourth connectors couple with said one or more third connectors, said one or more first connectors electrically coupling with said one or more second connectors via said one or more third and fourth connectors, allowing said top and bottom sections to electrically connect via said one or more third and fourth connectors.

18. The modular die cast enclosure system of claim 17, wherein the internal cover substantially covers an entire opening of the top or bottom casing of the one of the top and bottom sections in which the internal cover is comprised and wherein the second internal cover substantially covers an entire opening of the top or bottom casing of the other one of the top and bottom sections in which the second internal cover is comprised.

19. The modular die cast enclosure system of claim 17, wherein said one or more first connectors are provided on said bottom mid-plane and said one or more second connectors are provided on said top mid-plane, wherein said internal cover is comprised in the bottom section and said second internal cover is comprised in the top section, and wherein, when the top section is secured to the bottom section, said top and bottom mid-planes provide electrical connection between said top and bottom sections via: said one or more first connectors coupling with said one or more third connectors provided in the internal cover; and said one or more second connectors coupling with said one or more fourth connectors provided in the second internal cover.

20. A modular die cast enclosure comprising:

a top section with a top mid-plane;

a bottom section with a bottom mid-plane and an internal bottom cover;

one or more of a first type of connectors on the bottom section;

one or more of a second type of connectors on the top section;

one or more of a third type of connectors on the internal bottom cover;

an internal top cover with one or more fourth type connectors to cover said top section wherein said top second types of connectors couple to the fourth types of connectors and the third types of connector couple to the other side of the fourth type of connectors to electrically connect said top and bottom section, wherein said first type of connectors couple with said second type of connectors when the top section is placed on the bottom section and allow to electrically connect said top and bottom sections via said third type of connectors.

* * * * *